(12) United States Patent
Kusunoki et al.

(10) Patent No.: US 7,681,997 B2
(45) Date of Patent: Mar. 23, 2010

(54) INKJET RECORDING APPARATUS

(75) Inventors: Ryutaro Kusunoki, Shizuoka (JP);
Tomoka Takanose, Shizuoka (JP);
Toshio Miyazawa, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 470 days.

(21) Appl. No.: 11/758,904

(22) Filed: Jun. 6, 2007

(65) Prior Publication Data

US 2007/0285455 A1    Dec. 13, 2007

(30) Foreign Application Priority Data

Jun. 7, 2006    (JP) ............................ P2006-158434

(51) Int. Cl.
*B41J 2/045*    (2006.01)
*B41J 2/17*    (2006.01)

(52) U.S. Cl. .......................................... 347/70; 347/84
(58) Field of Classification Search ................... 347/70, 347/68–69, 71–72, 46, 54, 84, 85; 400/124.14–124.17, 400/124.23; 310/323.06, 323.08, 324, 330, 310/331

See application file for complete search history.

(56) References Cited

U.S. PATENT DOCUMENTS

2006/0214966 A1 * 9/2006 Tatsumi ...................... 347/15

FOREIGN PATENT DOCUMENTS

JP    2004-314459    11/2004

OTHER PUBLICATIONS

Notice of Rejection issued in Application No. JP 2006-158434 mailed May 7, 2008.
English translation of Notice of Rejection issued in Application No. JP 2006-158434 mailed May 7, 2008.
Partial English translation of JP Publicaton No. H11-42795, Feb. 26, 1999.
Machine translation of JP 2004-314459, Jun. 8, 2006.
English Language Abstract, JP 2004-314459 (2 pages).

* cited by examiner

*Primary Examiner*—K. Feggins
(74) *Attorney, Agent, or Firm*—DLA Piper US LLP

(57) ABSTRACT

An inkjet recording apparatus comprises an inkjet recording head, an ink-testing unit having an ink-test chamber, a pressure-vibration generating unit that generates a pressure vibration in the ink-test chamber, a pressure-vibration detecting unit that detects the pressure vibration, an ink inlet that introduces ink into the ink-test chamber and an ink outlet through which ink is discharged from the ink-tester chamber. Failures of ink ejection can be prevented by detecting cavitation cores by the ink-test chamber and removing ink containing the cavitation cores from ink supplied to the inkjet recording head.

5 Claims, 9 Drawing Sheets

(a) In a state of printing (b) In a state of maintenance

INKJET RECORDING APPARATUS

BACKGROUND OF THE INVENTION (1) Field of the Invention

The present invention relates to an inkjet recording apparatus, particularly to an inkjet recording apparatus that prevents failures of ink-ejection.

(2) Description of the Related Art

A problem of an ink-ejection failure, i.e. failing in normal ejection of ink droplets in an inkjet recording apparatus, is generally known. When an inkjet recording apparatus is used in production of electronic devices and ink-ejection failures occur, a great loss results because the ink-ejection failures are directly linked to production failures. If such ink-ejection failures can be foreseen and prevented, the loss can be avoided.

Relating to the above problem, Japanese laid-open patent publication No. 2004-314459 (hereafter referred to as JP '459) discloses a technique of preventing an ink-ejection failure by projecting the ink-ejection failure, which occurs due to an increase of ink viscosity and entraining of air bubbles into a cavity, from patterns of a pressure vibration by detecting, through a pressure plate, a pressure vibration of the ink within a pressure chamber (referred to as "cavity" in JP '459) in which a pressure for ejecting ink is produced.

One of the causes of the ink-ejection failure is cavitation, which occurs being associated with descending of an ink pressure when a pressure vibration is generated to eject ink. This cavitation occurs under the condition where cores, i.e. the cause of the cavitation, exist within ink and when a pressure of ink remarkably descends.

The art disclosed in JP '459 involves a problem that such ink-ejection failures cannot be prevented due to the reasons described below. In the case that the amplitudes of a pressure vibration that is detected are small even if the cavitation cores exit, this pressure vibration is virtually the same as in the case of non-existence of the cores within the ink. Therefore, the presence of the cores cannot be detected. Even in the case that an amplitude of pressure vibration detected is large, an occurrence of cavitation cannot be projected before the ink is ejected, because the ink as the object to be deleted has been discharge from nozzle.

SUMMARY OF THE INVENTION

To solve the above-described problem, there is provided an inkjet recording apparatus according to one embodiment of the present invention, comprising:

an inkjet recording head including an nozzle from which ink is ejected, a pressure chamber fluidly communicated with the nozzle, an ink supplying unit that supplies ink to the pressure chamber, and actuators for varying capacity of the pressure chamber; an ink-testing unit including an ink-test chamber, a pressure-vibration generating unit for generating a pressure vibration in said ink-test chamber, a pressure-vibration detecting unit for detecting the pressure vibration; and ink inlet through which the ink within said ink-test chamber is discharged; and a connecting unit for fluidly connecting the ink supplying unit with the ink outlet.

BRIEF DESCRIPTION OF THE DRAWINGS

These and other objects and advantages of this invention will become apparent and more readily appreciated from the following detailed description of the presently preferred exemplary embodiments of the invention taken in conjunction with the accompanying drawings, wherein.

DETAILED DESCRIPTION OF THE INVENTION

Figure 1:
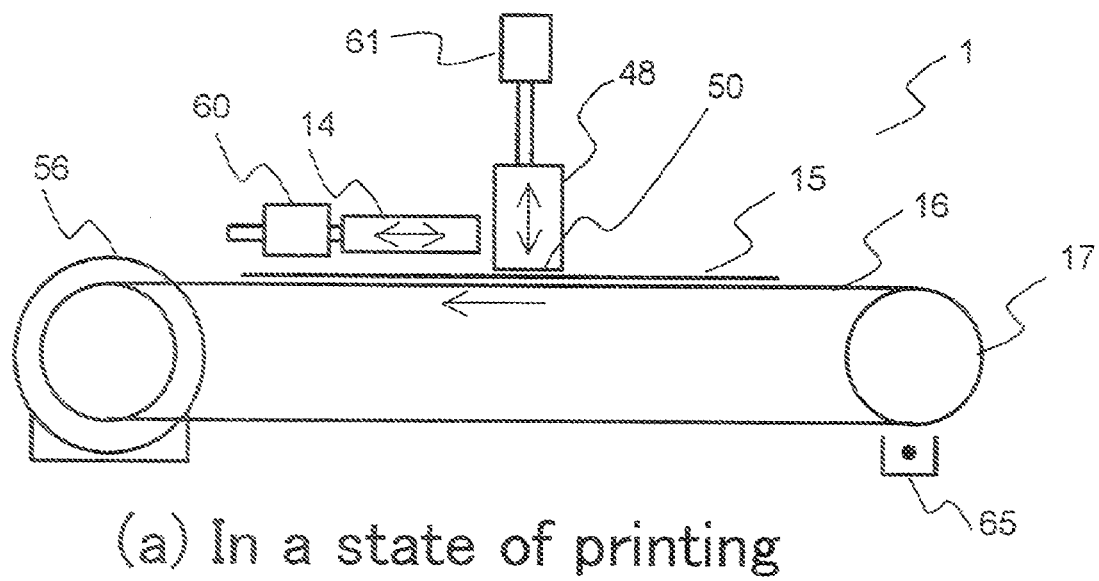
FIG. 1 is a schematic diagram of an inkjet recording apparatus according to one embodiment of the present invention.
Figure 1:
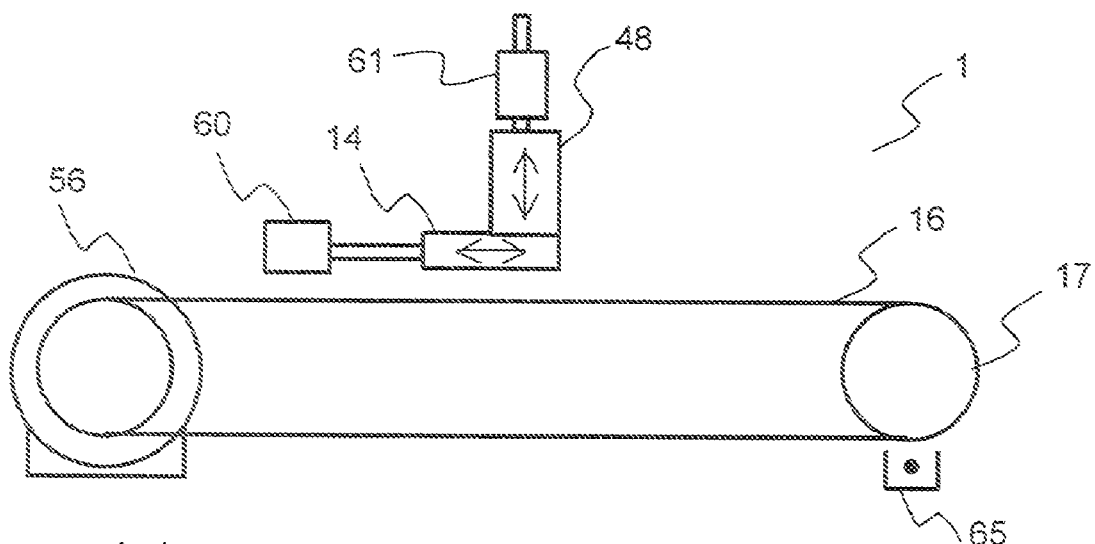

The present invention will now be described in more detail with reference to the accompanying drawings. However, the same numerals are applied to the similar elements in the drawings, and therefore, the detailed descriptions thereof are not repeated.

The preferred embodiment according to the present invention will now be described below. "Ink" referred in the present invention includes not only a coloring material that merely forms characters or images but also a liquid that is ejected onto a printed medium by an inkjet recording apparatus including, e.g., electrically conductive materials used for forming wiring patterns of an electric circuit. The printing material also referred in the present invention means not only recording materials such as paper that merely retains information of characters, images, or the like on its surface but also materials including a substrate used for an electric circuit on which a liquid ejected by an inkjet recording apparatus is made to be deposited.

Now, a structure of an inkjet recording apparatus according to the present invention will be described.

Figure 2:
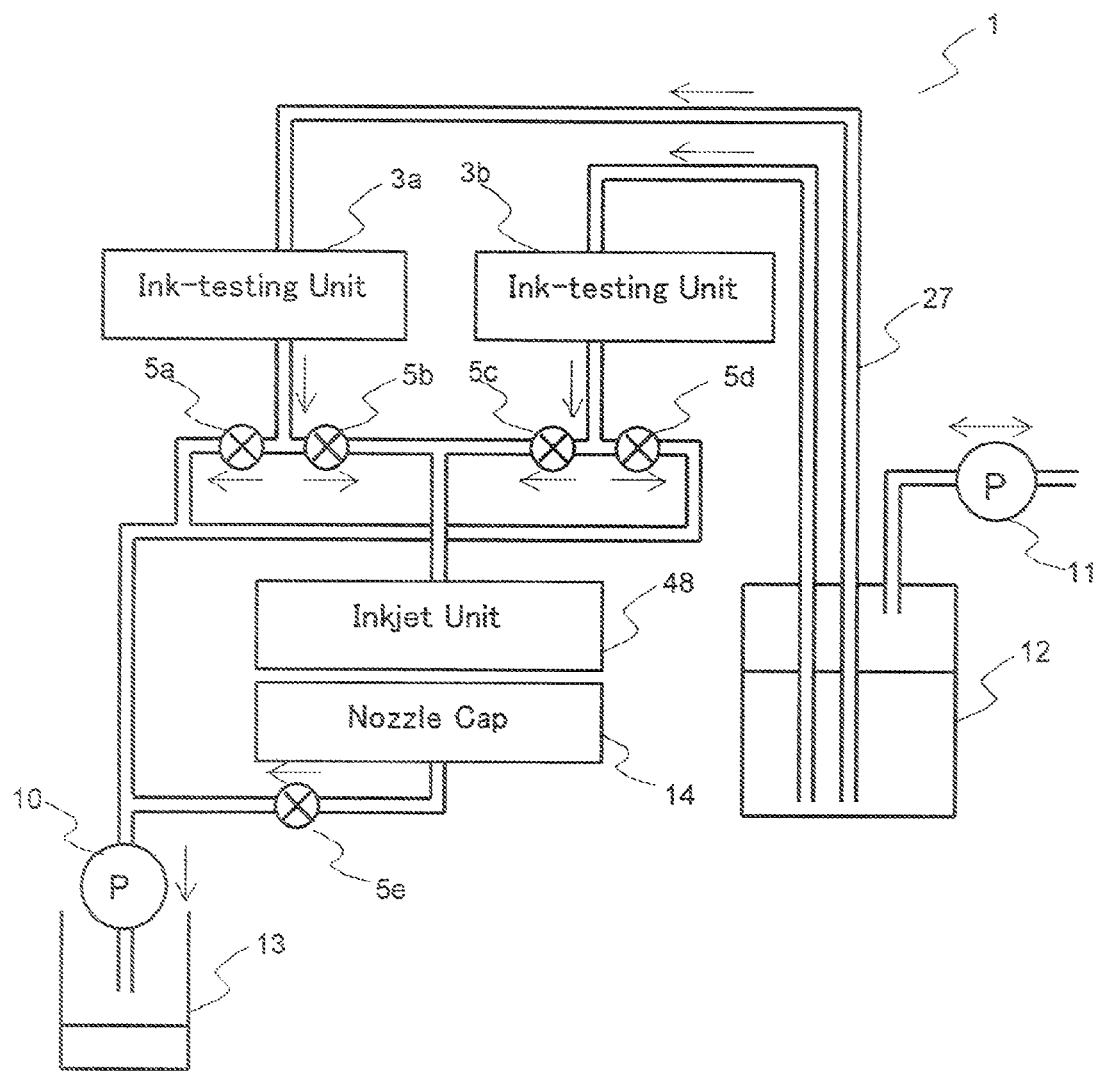
FIG. 2 is a schematic diagram of an ink supply system according to the same embodiment of the present invention.
Figure 3:
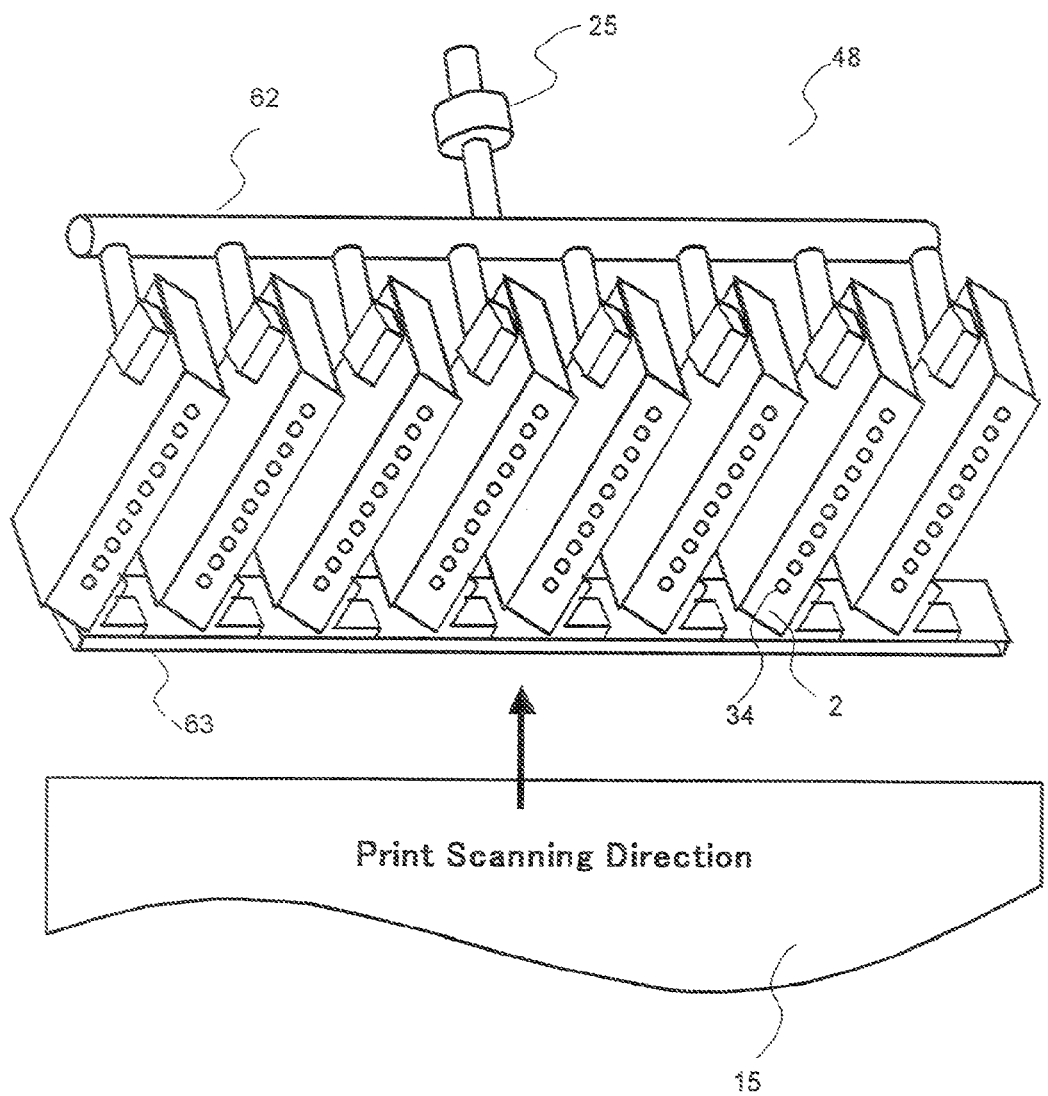
FIG. 3 is a schematic diagram of an inkjet unit according to the same embodiment of the present invention.

As illustrated in FIGS. 1-3, inkjet recording apparatus is comprised of an inkjet unit 48 comprising multiple inkjet recording heads 2 each ejecting ink, conveying unit for conveying a printing medium 15, ink-testing units 3a and 3b for testing ink supplied to inkjet unit 48, an ink-discharging unit for discharging unwanted ink, nozzle cap 14 for collecting ink from nozzles of inkjet unit 48, a drive unit for moving inkjet 48 and nozzle cap 14, an ink supply system coupled to inkjet unit 48 and nozzle cap 14, and electrical circuits that control and drive these structural components.

Referring to FIG. 1, the conveying unit is comprised of a conveyer belt 16, a conveying roller 17, and a conveyance motor 56 that drives the conveying roller. The conveying unit is provided with a charger unit 65 in the vicinity of conveyer belt 16, and carries a printing medium 15 by sucking the medium onto conveyer belt 16 by means of an electrostatic force.

Referring to FIG. 1(a), when inkjet recording apparatus 1 is in a state of printing, inkjet unit 48 is held in the vicinity of conveyer belt 16. In this state, nozzle cap 14 is positioned escaping to a position where it does not disturb the operations of printing.

Referring to FIG. 1(b), in a maintenance state of inkjet recording apparatus 1, inkjet unit 48 is set apart from conveyer belt 16 by drive units 60 and 61, moving to a position where nozzle cap 14 covers nozzles 34 of inkjet unit 48. In this state, nozzle cap 14 can collect ink discharged from nozzles 34.

Referring to FIG. 2, the ink supply system is comprised of an ink tank 12 that stores ink, two ink-testing units 3a and 3b for testing ink, magnetic valves 5a, 5b, 5c, and 5d that each change a flow of the ink, a drainage pump 10 that discharges waste ink, a waste-ink storage tank 13 that stores discharged ink, and a pressure-adjusting pump 11 that adjusts a static pressure of the ink supplied to inkjet unit 48. The system is configured so that ink-testing units 3a and 3b are provided in parallel and the direction of the ink supply can be selected either toward the waste-ink discharging side or toward inkjet unit 48 by magnetic valves 5a, 5b, 5c, and 5d. The arrows in the FIGURE indicate directions of the ink or airflow.

Magnetic valves 5a and 5b compose an ink-discharging unit in pairs. Similarly, magnetic valves 5c and 5d compose another ink-discharging unit in pairs.

Pressure-adjusting pump 11 adjusts an ink pressure within ink tank 12 based on a value of a static pressure detected by a pressure sensor 25 that is provided in inkjet unit 48. The static pressure of the ink supplied to inkjet unit 48 is adjusted to such a value that neither the ink runs out of the nozzles nor air is pulled into the nozzles from outside of the inkjet unit 48.

Inkjet unit 48 is comprised of, as illustrated in FIG. 3, a plurality of inkjet recording heads 2, frame 63 that holds inkjet recording heads 2, ink-branching unit 62 that branches the ink supplied from outside of the inkjet unit to the individual inkjet recording heads 2, and a pressure sensor that detects a static pressure of the ink supplied to inkjet unit 48.

Inkjet recording heads 2 are held by frame 63 at a predetermined angle relative to the printing scanning direction. Thus, high-resolution printing can be performed by a single operation of scanning.

Figure 4:
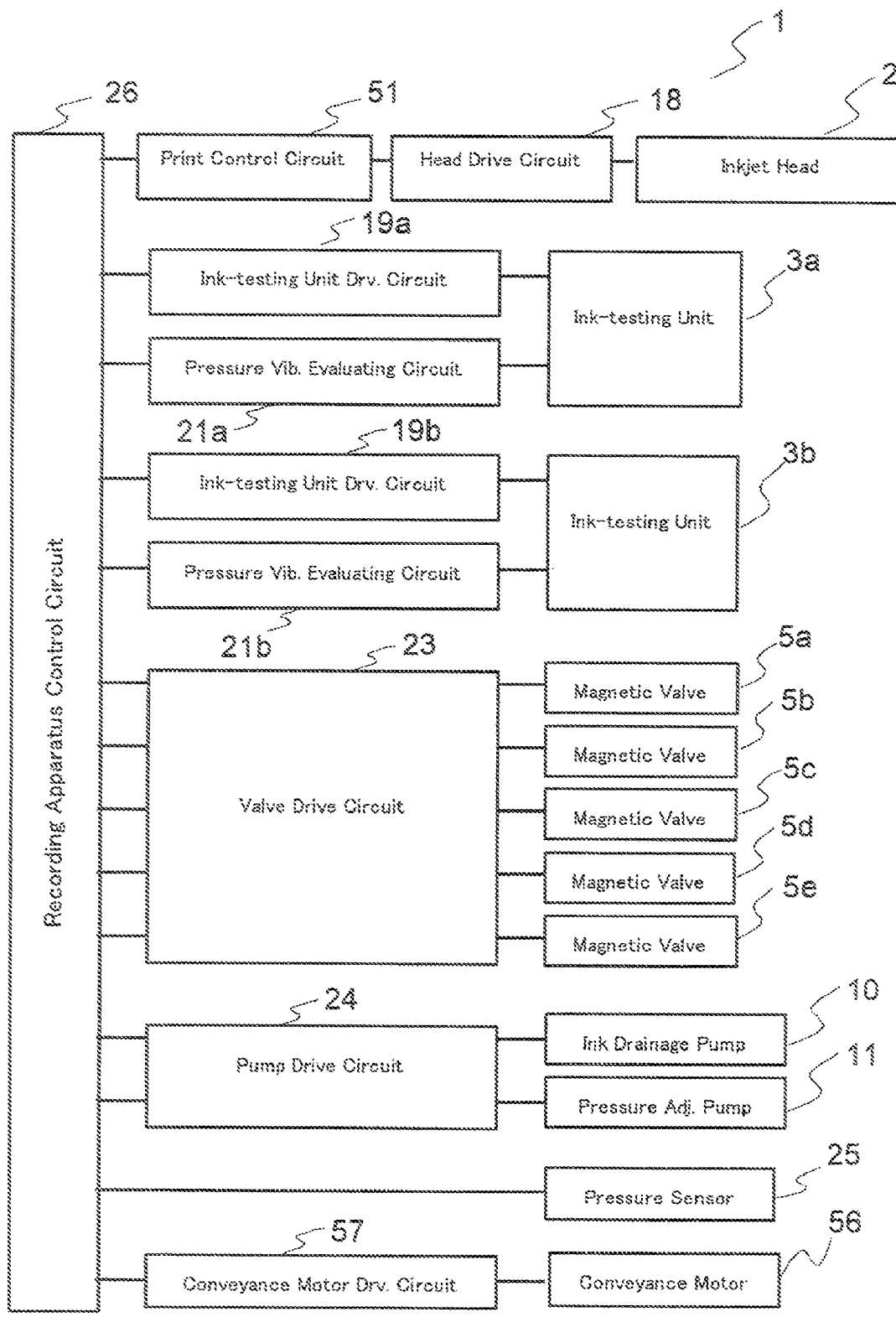
FIG. 4 is a block diagram of a drive circuit according to the same embodiment of the present invention.

Referring to FIG. 4, the electric circuitry that controls inkjet recording apparatus 1 is comprised of a circuit for controlling the inkjet recording heads, a circuit for controlling the testing of the ink, a circuit for controlling the supply of the ink, a conveyance motor drive circuit 57 for driving conveyance motor 56 that conveys printing medium 15, and a recording apparatus control circuit 26 for integrally controlling these circuits. The inkjet recording head control circuit is comprised of a head drive circuit 18 that generates drive signals of inkjet recording heads 2 and a print control circuit 51 for controlling head drive circuit 18 according to print patterns. The control circuit for the ink-testing unit is comprised of ink-testing unit drive circuits 19a and 19b for driving a pressure-vibration generating unit 54 in ink-testing units 3a and 3b, and pressure-vibration evaluating circuits 21a and 21b that evaluates an electric signal generated by pressure-vibration detecting means 55 provided in ink-testing units 3 and judges a result of test of the ink. The ink-supply control circuit is comprised of a valve drive circuit 23 that individually opens and closes magnetic valves 5a, 5b, 5c, 5d, and 5e, and a pump drive circuit 24 that individually drives drainage pump 10 and pressure-adjusting pump 11.

Figure 5:
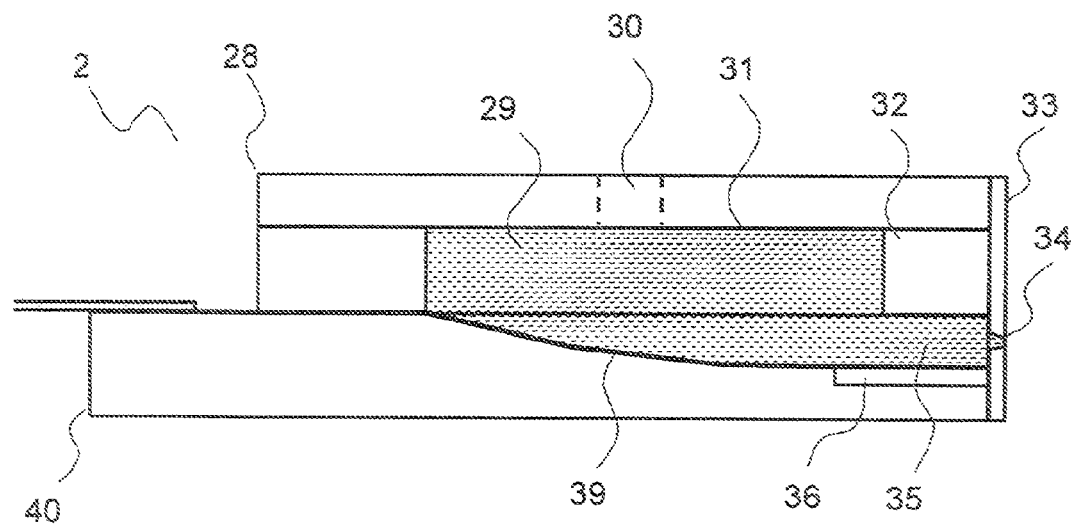
FIG. 5 is a vertical cross-sectional view of an inkjet recording head according to the same embodiment of the present invention.
Figure 6:
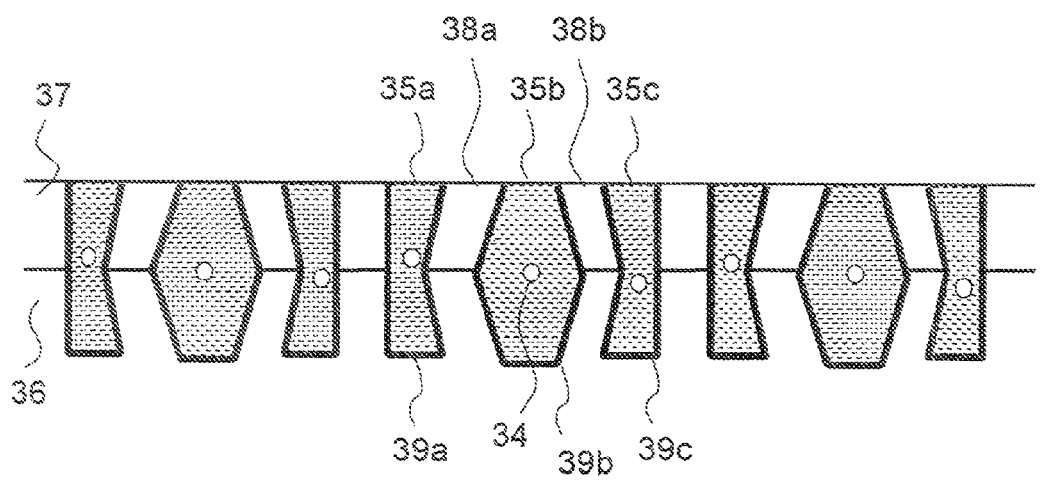
FIG. 6 is a traverse cross-sectional view of an inkjet recording head according to the same embodiment of the present invention.

Inkjet recording head 2, as illustrated in FIGS. 5 and 6, is composed by a plurality of nozzles 34 that eject ink, a plurality of pressure chambers 35 that are communicated with the respective nozzles, a plurality of electrodes 39 formed on interior surfaces of the respective pressure chambers, a plurality of actuators 38a and 38b that are provided between pressure chambers 35, a common pressure chamber 31 that supplies ink being communicated with individual pressure chambers 35, and an ink supply port 30 from which ink is fed to common pressure chamber 31. Actuators 38a and 38b are each comprised of a lower piezoelectric member 36 and an upper piezoelectric member 37. Lower piezoelectric member 36 is polarized in its thickness direction, while upper piezoelectric member 37 is polarized in an opposite direction to that of lower piezoelectric member 36. Individual electrodes 39 are formed electrically independently and are separately connected to head drive circuit 18. Ink supply port 30 and common pressure chamber 31 compose an ink supplying unit that supplies ink to pressure chambers 35.

When a drive signal from head drive circuit 18 is applied to, for example, electrode 39b in a state that ink is filled within pressure chamber 35 and nozzle 34, the actuators deforms in the shear mode by the effect of the electric field and the capacity of the pressure chamber 35 varies. Thereby ink filled within pressure chambers 35 is pressurized and a pressure vibration occurs within pressure chamber. By this pressure vibration an ink droplet is ejected from nozzle 34.

When multiple drive signals are continuously applied to the electrode from head drive circuit 18, inkjet recording head 2 continuously ejects the number of ink droplets corresponding to the number of the drive signals. As the ink droplets that are successively ejected are deposited on printing medium 15, the multiple droplets merge forming one dot having a size corresponding to the number of the ink droplets. Thus, so-called gradation control is enabled by controlling the number of the drive signals outputted by head drive circuit 18.

As the ink droplet is ejected, ink is replenished in inkjet recording head 2 from ink tank 12 via ink-testing unit 3 by the ink-refilling effect that naturally occurs within nozzle 34.

Figure 7:
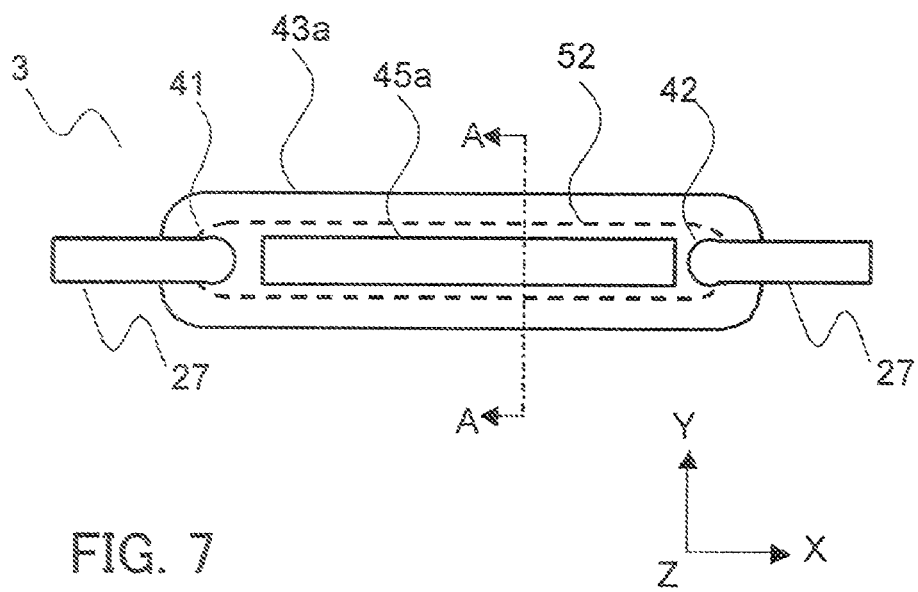
FIG. 7 is an external view of an ink-testing unit according to the same embodiment of the present invention.
Figure 8:
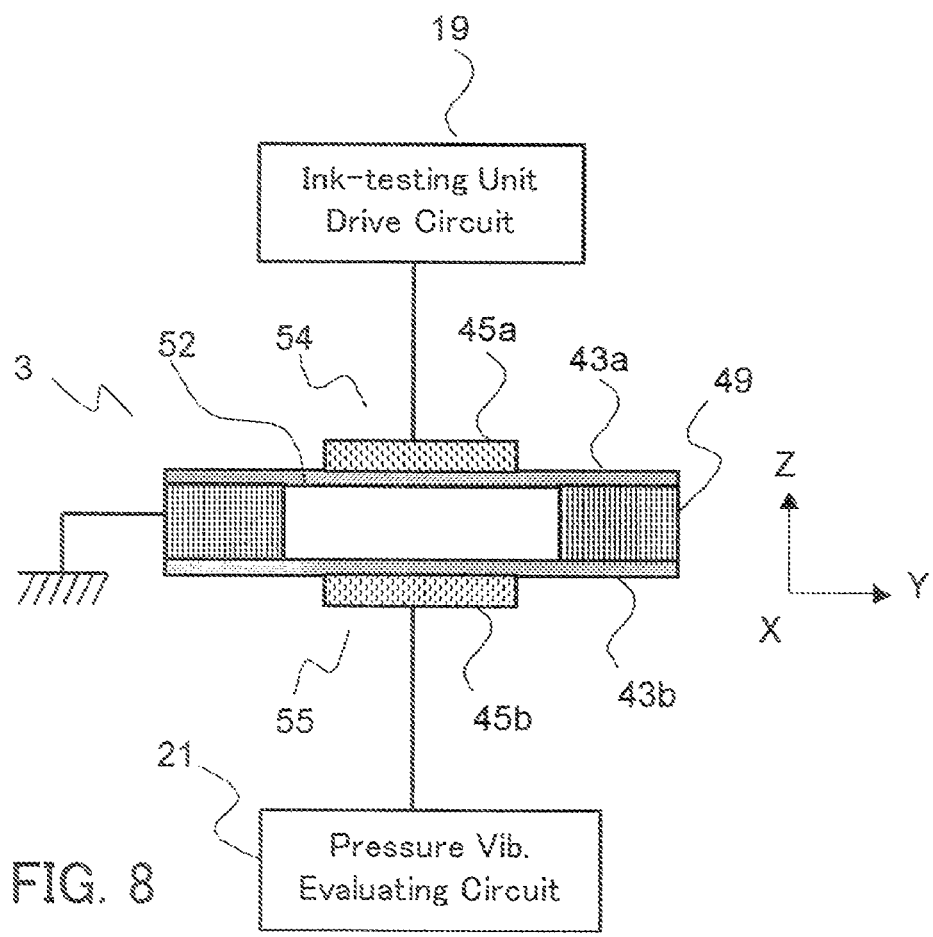
FIG. 8 is a cross-sectional view of the ink-testing unit according to the same embodiment of the present invention.

The structure of ink-testing unit 3 will be described in reference to FIGS. 7 and 8. FIG. 7 is an elevational view of the ink-testing unit; FIG. 8 is a cross sectional view taken on line A-A in FIG. 7. Ink-testing unit 3 is comprised of a frame 49 having an ink-testing chamber 52 therein, a vibration plate 43a that is secured tone surface of frame 49, a vibration plate 43b that is secured to the other surface of frame 49, a piezoelectric member 45a that is secured to vibration plate 43a, a piezoelectric member 45b that is secured to vibration plate 43b, an ink inlet 41 and ink outlet 42 formed within vibration plate 43a.

Ink inlet 41 and ink outlet 42 are respectively connected to tubes 27. Tubes 27 are formed of a flexible material. This flexibility prevents the transmission of pressure vibration, which is generated within ink-testing chamber 52, to inkjet recording head 2 through tube 27.

Frame 49 and vibration plates 43a and 43b are electrically conductive members. They are interconnected maintaining their conductivity and are grounded to the reference voltage of the electric circuit of inkjet recording apparatus 1.

Piezoelectric members 45a and 45b are polarized in a Z direction. An electrode is formed on a surface opposite vibration plate 43a of piezoelectric member 45a. Similarly, and electrode is also formed on a surface opposite vibration plate 43b of piezoelectric member 45b. The electric formed on piezoelectric member 45a is electrically connected to ink-testing unit drive circuit 19; the electrode formed on piezoelectric member 45b is electrically connected to pressure-vibration evaluating circuit 21.

Vibration plate 43a and piezoelectric member 45a compose a pressure-vibration generating unit 54 that imparts pressure vibration to the ink filled within the ink-testing chamber. Piezoelectric member 45a expands and contracts in Z-direction and Y-direction driven by a drive signal from ink-testing unit drive circuit 19. Vibration plate 43a is bent in a Z-direction associated with this expansion and contraction in a Y-direction. This bending action produces a pressure that impresses the ink within ink-testing chamber 52 so that a pressure vibration of the ink occurs.

Figure 9:
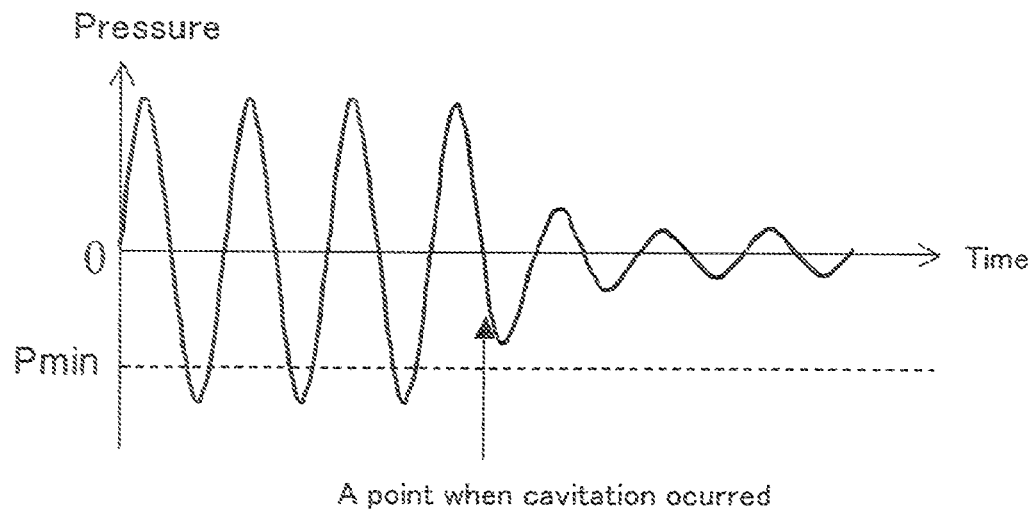
FIG. 9 is a diagram showing pressure vibration occurred in an ink-testing unit and a related voltage vibration according to the same embodiment of the present invention.
Figure 9:
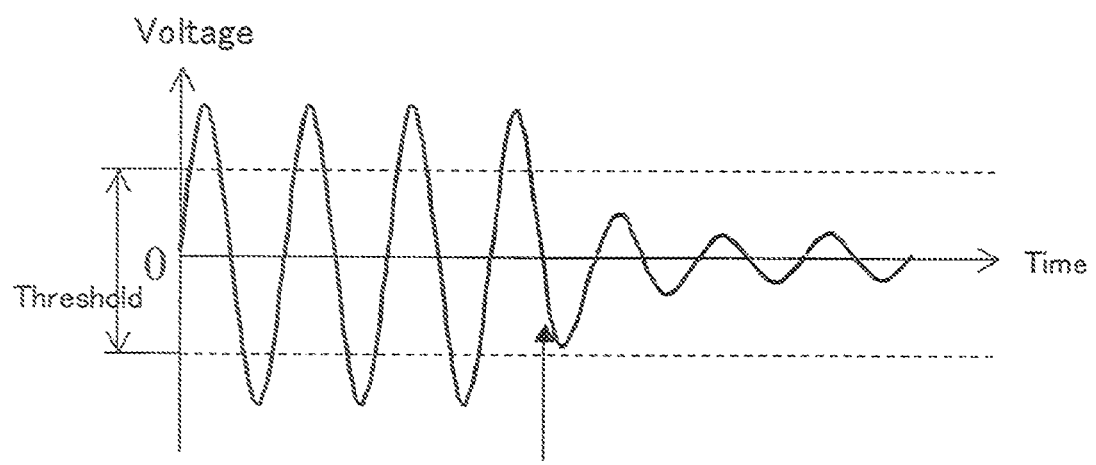

Vibration plate 43b and piezoelectric member 45b compose a pressure-vibration detecting unit 55 that detects the pressure vibration of the ink that is filled within ink-testing chamber 52. The pressure of the ink produced within ink-testing chamber 52 by the action of the expansion and contraction of piezoelectric member 45a effects to bend vibration plate 43b. This bending action expands and contracts piezoelectric member 45b in both Y-direction and X-direction. According to this expansion and contraction in Z-direction, piezoelectric member 45b generates a voltage vibration as shown in FIG. 9 according to the pressure vibration within ink-testing chamber 52.

Pressure vibration evaluating circuit 21 tests the ink detecting the voltage vibration. This pressure vibration evaluating circuit 21 tests if the amplitude of the voltage vibration is greater or smaller than a predetermined threshold value. The circuit judges that, if the amplitude is greater, the ink is normal ink that does not cause and ink-ejection failure by cavitation; it judges that, if smaller, the ink is abnormal ink that causes an ink-ejection failure.

For example, where the ink within ink-testing chamber 52 does not contain a cavitation core, cavitation does not occur even if a negative pressure is produced within ink-testing chamber 52 in cooperation with the pressure vibration created by pressure-vibration generating unit 54. Because no cavitation occurs, the amplitude of pressure vibration ink-testing chamber 52 is large. In this case, since the amplitude of pressure vibration created by pressure-vibration detecting unit 55 is greater than the threshold value, pressure-vibration evaluating circuit 21 judges the ink within ink-testing chamber 52 is to be normal ink.

On the other hand, in the case that the ink within ink-testing chamber 52 contains some cavitation cores, cavitation occurs within ink-testing chamber 52 due to a negative pressure by the pressure vibration created by pressure-vibration generating unit 54. When the cavitation occurs, air bubbles produced by the cavitation absorb the pressure vibration within in-testing chamber 52 and thus the amplitude of the pressure vibration is diminished. Accordingly, the amplitude of the voltage vibration generated by pressure-vibration detecting unit 55 becomes smaller than the threshold value, pressure vibration evaluating circuit 21 judges that the ink within ink-testing chamber 52 is to be abnormal ink.

Figure 10:
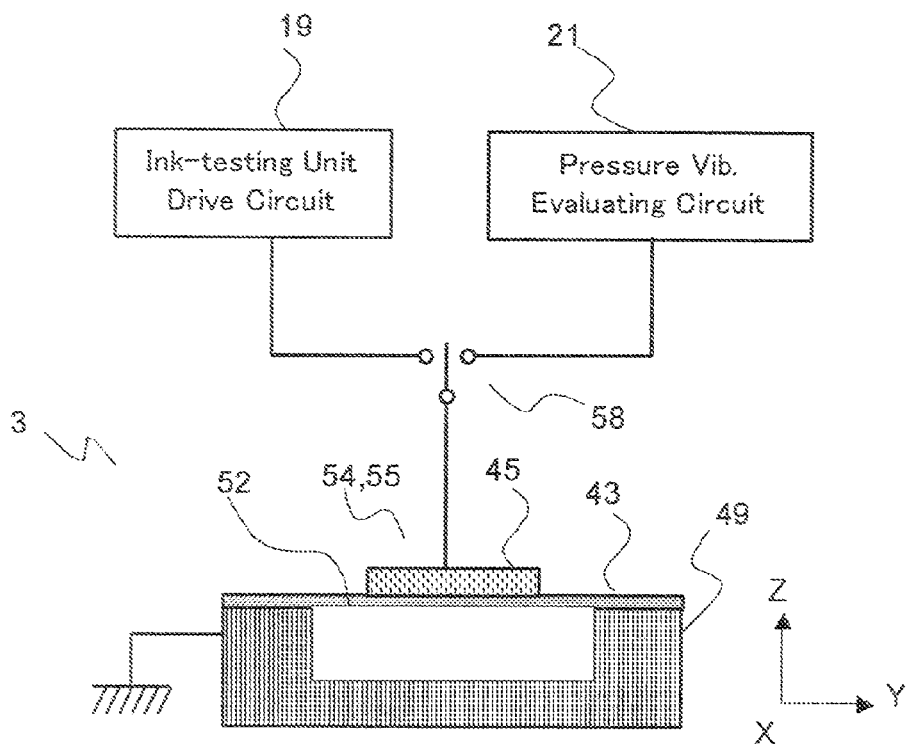
FIG. 10 is a modified example of an ink-testing unit according to the present invention.

Each of the above ink-testing units is formed to separately comprise pressure-vibration generating unit 54 and pressure-vibration detecting unit 55. In lieu of this structure, a structure that makes pressure-vibration generating unit 54 of ink-testing unit 3 serve also as pressure-vibration detecting unit 55 as shown in FIG. 10 may be formed. In this case, the structure may be constructed such that: a circuit selecting unit 58 is provided; ink-testing unit 3 is first connected to ink-testing unit drive 19 so as to generate a pressure vibration within ink-testing chamber 52; subsequently, ink-testing unit 3 is switched to pressure-vibration evaluating circuit 21 to evaluate the amplitude of a residual pressure-vibration within ink-testing chamber 52.

In this embodiment, piezoelectric member 45 is employed for both pressure-vibration generating unit 54 and pressure vibration detecting unit 55. However, these generating unit and detecting unit can be composed using, for example, an electrostatic force.

Now, operations of inkjet recording apparatus 1 according to the present invention will be described. In this case, it will be assumed that ink-testing unit 3 and inkjet unit 48 are already filled with ink.

When inkjet recording apparatus 1 performs printing, inkjet unit 48 and nozzle cap 14 are situated in the printing state. Magnetic valves 5b and 5c are opened and magnetic valves 5a and 5d are closed.

When data of a print pattern is sent to recording apparatus control circuit 26, recording apparatus control circuit 26 transfers the data to print control circuit 51 and drives conveyer drive motor 53 so as to convey printing medium 15. Also, the recording apparatus control circuit drives pressure-vibration generating unit 54 of ink-testing unit 3.

When printing medium 15 passes under inkjet 48, print control circuit 51 sends a control signal according to a gradient value of a print pattern to head drive circuit 18 and then head drive circuit 18 sends the number of drive signals according to the gradient value to inkjet recording head 2.

Receiving the drive signals, inkjet recording head 2 performs printing by continuously ejecting ink droplets from nozzle 34 according to the number of the drive signals. In tandem with the operation of this ink-ejection, the ink corresponding to the amount of the ink that is ejected is replenished to nozzle 34 from ink tank 12 through ink-testing unit 3 by means of a natural refilling action.

When the ink is replenished to nozzles 34, the ink flows into ink-testing chamber 51 from ink inlet 41 of ink-testing unit 3, and the ink that has been tested is expelled from ink-testing chamber 52 to ink outlet 42.

Pressure vibration detecting unit 55 tests the ink passing through ink-testing chamber 52 detecting pressure vibration generated by pressure-vibration generating unit 54, and judges whether the ink therein is abnormal ink having the cavitation cores or normal ink.

For example, in the case that ink abnormality is not detected in ink-testing unit 3a but is detected in ink-testing unit 3b, magnetic valve 5d is made opened while magnetic valve 5c is made closed so that ink-testing unit 3b is connected to drainage pump 10. Meantime, since abnormality of the ink was not detected in ink-testing unit 3a, magnetic valve 5a remains closed and magnetic valve 5b remains opened. Furthermore, while magnetic valve 5e is made closed and drainage pump 10 starts to operate. Thereby the abnormal ink that has been detected by ink-testing unit 3b is discharged into waste-ink storage tank 13 via magnetic valve 5d and drainage pump 10. Even during this operation of ink discharging ink-testing means 3b continues performing of detecting abnormal ink. When abnormal ink becomes undetected, the drainage pump is made to stop, magnetic valve 5c is opened, and magnetic valve 5d is closed.

The abnormal ink detected by ink-testing mean 3b in a series of such operations is waste ink storage tank 13 without flowing into inkjet unit 48. In the meantime, the ink that is judged to be normal by ink-testing unit 3a is continuously supplied to inkjet unit 48 via magnetic valve 5b. In this way, inkjet recording apparatus 1 can discharge the abnormal ink without intermitting the performance of printing.

In the case, for example, that the abnormal ink is detected by both ink-testing units 3*a* and 3*b* simultaneously, magnetic valves 5*a* and 5*d* are opened while magnetic valves 5*b* and 5*c* are closed. Furthermore, magnetic valve 5*e* is made closed and the drainage pump 10 starts to operate. As a result, the abnormal inks detected by ink-testing units 3*a* and 3*b* are separately discharged into waste-ink storage tank 13 via magnetic valves 5*a* and 5*d* and drainage pump 10. Even during this operation of ink discharging, ink-testing units 3*a* and 3*b* continue to detect the abnormal ink. When the abnormal ink becomes undetected, the drainage pump is stopped, magnetic valves 5*b* and 5*c* are opened, and magnetic valves 5*a* and 5*d* are closed.

By the series of these operations, the abnormal inks detected by ink-testing units 3*a* and 3*b* are discharged into waste-ink storage tank 13 without flowing into inkjet unit 48. In the case that the abnormal ink is detected in both ink-testing units 3*a* and 3*b*, inkjet recording apparatus 1 must suspend the printing operation because of the disconnection of ink supply to inkjet unit 48. However, since the possibility that the abnormal ink is detected simultaneously in the two ink-testing units 3*a* and 3*b* is extremely slim, the interruption of printing in inkjet recording apparatus 1 rarely occurs. Although in this embodiment two ink-testing units are implemented, the possibility of the printing interruption can be reduced by increasing the number of the ink-testing units.

Figure 11:
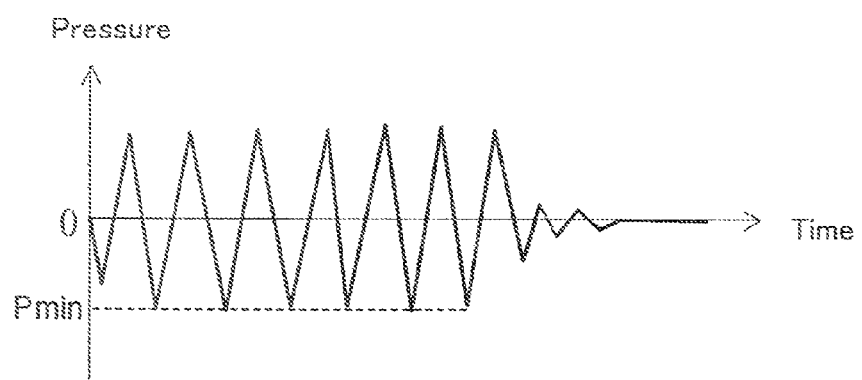
FIG. 11 is a diagram showing a pressure vibration occurred in a pressure chamber of the inkjet recording head according to the embodiment of the present invention.

To judge abnormality of the ink, as shown in FIG. 9, the drive signal of ink-testing unit drive circuit 19 is set so that the lower limit of the pressure vibration in ink-testing chamber 52 becomes lower than the lower limits of the pressure vibration, Pmim (FIG. 11), that is generated in pressure chambers 35 inkjet recording head 2. Since the possibility of occurrence of cavitation increases as the pressure becomes lower, the ink-ejection failure due to cavitation that occurs within pressure chambers 35 can be more assuredly prevented by lowering the lower limit of the pressure vibration that is created within ink-testing chamber 52. Than the lower limit of the pressure vibration created within pressure chambers 35.

Firstly, in the inkjet recording apparatus according to the present invention, because pressure chambers 35 where a pressure vibration for ejecting ink is generated is separated from ink-testing chamber 52 where a pressure vibration for testing the ink is generated, the pressure vibration for the ink testing cannot eject ink from nozzles 34. Accordingly, the amplitude of the pressure vibration that is generated to test the ink can be provided at a larger value. Thus, ink that causes cavitation that does not likely occur unless the pressure becomes sufficiently low can be detected before the operation of ink-ejection, and thereby ink-ejection failure due to cavitation can be prevented from occurring.

Furthermore, by setting the lower limit of the pressure vibration generated for testing ink lower than the lower limit of the pressure vibration generated for ejecting ink, an ink-ejection failure can be more assuredly prevented from occurring.

Secondly, because the inkjet recording apparatus according to the present invention is provided with an ink-discharging unit discharging ink between inkjet recording head 2 that ejects ink and ink-testing units 3*a* and 3*b* that test the ink based on a result of ink test by ink-testing units 3*a* and 3*b*, the ink that is judged by ink-testing units 3*a* and 3*b* to be one that likely causes an ink-ejection failure can be discharged without going through inkjet recording head 2. Since inkjet recording head 2 is structured finely and delicately, it becomes difficult to totally remove ink from the recording head, once ink that potentially causes an ink-ejection failure is induced therein. The ink-ejection failure can be prevented from occurring by discharging the ink that potentially causes an ink-ejection failure before the ink enters inside inkjet recording head 2. In addition, since there is no need to remove ink within inkjet recording head 2, the amount of the ink to be discharged can be reduced. Thus, an inkjet recording apparatus that does not waste ink can be provided.

Moreover, by providing ink-testing units 3*a* and 3*b* in parallel with each ink-testing unit serially coupled with an ink-discharging unit, discharging of the ink that potential causes an ink-ejection failure can be carried out without discontinuing an operation of printing by inkjet recording head 2.

Relating to the second effect in the above of the present invention, ink-testing unit 3 need not be limited to the structure, as used in this embodiment, that generates a pressure vibration. The same effect can be obtained by using a detecting unit employing other methods, e.g., a particle counter that optically detects particles or a dissolved oxygen meter.

Figure 12:
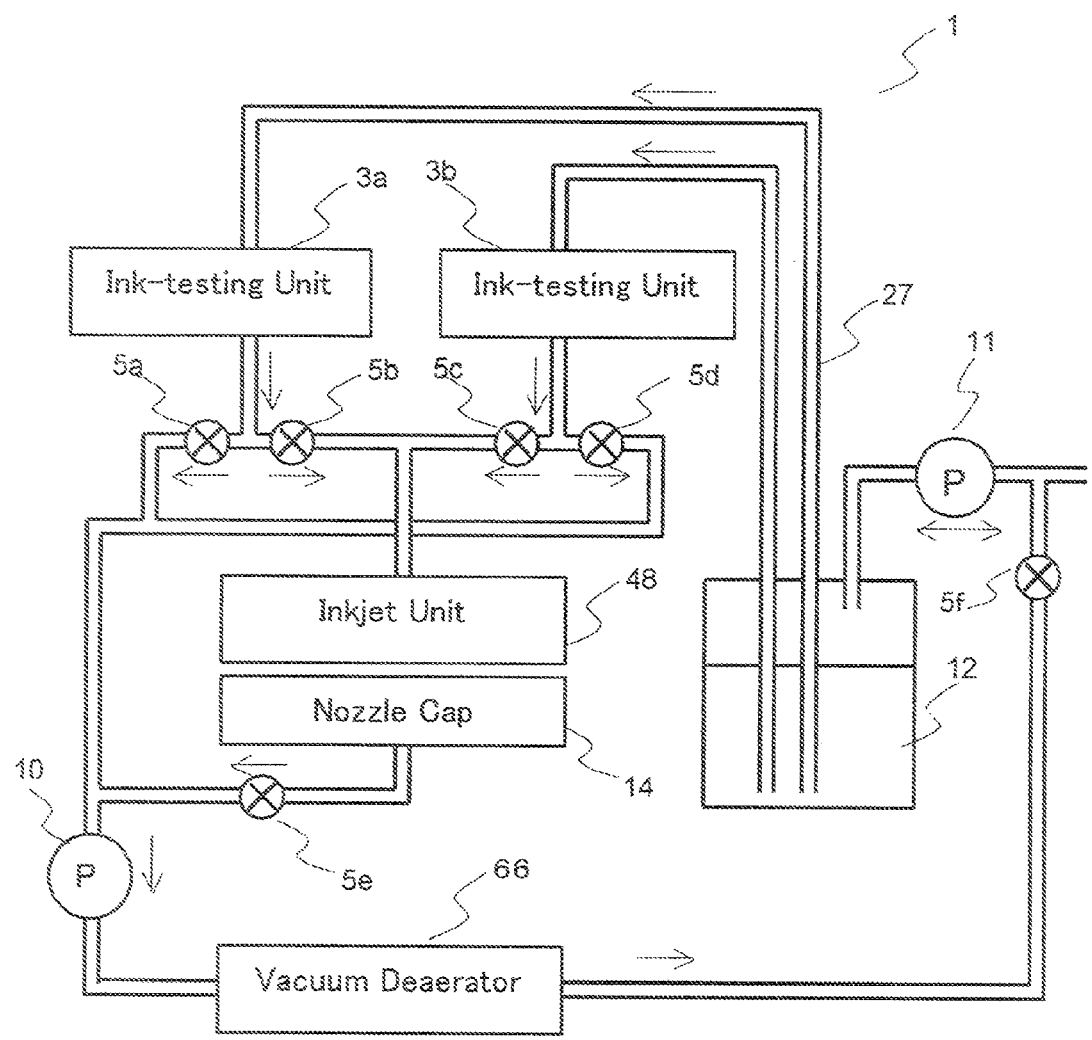
FIG. 12 is a modified example of the inkjet recording apparatus according to the present invention.

In the above embodiment, description has been made for inkjet recording apparatus that is provided with a discharge ink storage tank that stores ink discharged by the ink-discharging unit. Alternatively, the ink discharged through the ink-discharging unit may be returned to the ink supply system after the ink is reproduced by the ink-reproducing unit, as shown in FIG. 12. In this structure, a vacuum deaerator 66 is provided as the ink-reproducing unit, and the reproduced ink is returned to ink tank 12 via magnetic valve 5*f*. As the ink-reproducing unit, an ultrasonic generating device, filtering device using a filter, etc. may also be used. The amount of the ink that the ink-reproducing unit treats can be reduced by reproducing only ink that is discharged by ink-discharging unit 5. This yields such effects that the ink-reproducing unit can be downsized and energy consumed by the ink-reproducing unit can be saved.

The present invention has been described with respect to specific embodiments. However, other embodiments based on the principles of the present invention should be obvious to those of ordinary skill in the art. Such embodiments are intended to be covered by the claims.

What is claimed is:

1. An inkjet recording apparatus, comprising:
an inkjet recording head including a nozzle from which ink is ejected, a pressure chamber fluidly communicated with the nozzle, an ink supply unit that supplies ink to the pressure, and actuators that vary a capacity of the pressure chambers;
an ink-testing unit including an ink-test chamber, a pressure-vibration generating unit for generating a pressure vibration in the ink-test chamber, a pressure-vibration detecting unit for detecting an ink pressure-vibration in the ink-testing chamber, an ink inlet introducing ink into the ink-test chamber, and an ink outlet through which ink is discharged from the ink-test chamber; and
a path for fluidly connecting the ink supply unit and the ink outlet.

2. The inkjet recording apparatus according to claim 1, wherein a lower limit of a pressure of a pressure vibration generated within the ink-test chamber is set to be lower than a lower limit of a pressure of a pressure vibration generated within the pressure chamber.

3. An inkjet recording apparatus, comprising:
an inkjet recording head ejecting ink;
an ink-testing unit for testing ink supplied to the inkjet recording head; and
an ink-discharging unit that discharges the ink based on a result of test made by the ink-testing unit, the ink-discharging unit being fluidly connected between the ink-testing unit and the inkjet recording head.

4. The inkjet recording apparatus according to claim 3, wherein a plurality of ink-testing units and a plurality of ink-discharging units are provided and the plurality of ink-testing units are disposed in parallel, each of the ink-testing units being coupled with one of the ink-discharging units.

5. The inkjet recording apparatus according to claim 3, further comprising an ink-reproducing unit for reproducing ink that is discharged through the ink-discharging unit, wherein the ink reproduced by the reproduction unit is supplied to the inkjet recording head.

* * * * *